United States Patent [19]

Dolny et al.

[11] Patent Number: 4,641,164

[45] Date of Patent: Feb. 3, 1987

[54] BIDIRECTIONAL VERTICAL POWER MOS DEVICE AND FABRICATION METHOD

[75] Inventors: Gary M. Dolny, Middletown Township, Bucks County, Pa.; Lawrence A. Goodman, Plainsboro, N.J.

[73] Assignee: RCA Corporation, Princeton, N.J.

[21] Appl. No.: 868,633

[22] Filed: May 30, 1986

[51] Int. Cl.$^4$ .................. H01L 29/78; H01L 29/08; H01L 29/44

[52] U.S. Cl. .................. 357/23.4; 357/23.8; 357/23.14

[58] Field of Search ............. 357/23.4, 23.8, 23.14

[56] References Cited

U.S. PATENT DOCUMENTS

| 4,062,036 | 12/1977 | Yoshida | 357/22 |
| 4,249,190 | 2/1981 | Cho | 357/22 |
| 4,297,718 | 10/1981 | Nishizawa et al. | 357/22 |
| 4,378,629 | 4/1983 | Bozler et al. | 357/22 |
| 4,530,149 | 7/1985 | Jastrzebski et al. | 29/571 |
| 4,546,375 | 10/1985 | Blackstone et al. | 357/23.4 |
| 4,549,926 | 10/1985 | Corboy, Jr. et al. | 156/612 |
| 4,554,570 | 11/1985 | Jastrzebski et al. | 357/23.4 |
| 4,586,240 | 5/1986 | Blackstone et al. | 29/571 |

FOREIGN PATENT DOCUMENTS

| 55-133574 | 10/1980 | Japan | 357/23.4 |
| 58-175872 | 10/1983 | Japan | 357/23.4 |

OTHER PUBLICATIONS

Fabrication and Numerical Simulation of the Permeable Base Transistor, C. O. Bozler et al., *IEEE Transactions On Electron Devices*, vol. ED-27, No. 6, Jun. 1980, pp. 1128–1141.

*Primary Examiner*—William D. Larkins
*Assistant Examiner*—John Lamont
*Attorney, Agent, or Firm*—Birgit E. Morris; Donald S. Cohen; Kenneth R. Glick

[57] ABSTRACT

A vertical MOSFET in a silicon wafer having opposing major surfaces includes a source electrode on one surface, a drain electrode on the second surface, and an internally disposed insulated gate. The silicon between the insulated gate and each of the major surfaces is of first conductivity type and the silicon that is laterally adjacent to the insulated gate is of second conductivity type, such that a predetermined voltage on the insulated gate creates an inversion channel extending a predetermined distance into the laterally adjacent silicon. That portion of the laterally adjacent silicon where the inversion channel is formed is of relatively lightly doped material, whereas other areas of the laterally adjacent silicon is relatively heavily doped. The silicon that is between the insulated gate and each wafer surface includes a relatively lightly doped voltage-supporting region contiguous with the insulated gate and the laterally adjacent silicon and a relatively heavily doped region between this voltage-supporting region and the surface. Additionally, the interface between the insulated gate and the laterally adjacent silicon has a low density of interface states.

3 Claims, 6 Drawing Figures

BIDIRECTIONAL VERTICAL POWER MOS DEVICE AND FABRICATION METHOD

The present invention relates to a vertical metal oxide semiconductor field effect transistor (MOSFET) for use in power switching applications. More particularly, the invention relates to a device that will bidirectionally block relatively high voltages in the off state and bidirectionally pass relatively high current in the on state, under the control of a relatively low voltage applied to an insulated gate electrode.

BACKGROUND OF THE INVENTION

Applications exist, such as in motor control, in which it is desirable to have an electronic component that will block relatively high voltages (greater than 50 volts) and pass relatively high current (greater than 100 amps) in either direction. Configurations such as a pair of complementary symmetry conductivity modulated field effect transistors (COMFETs), or a pair of series-connected power MOSFETs, may be used for this purpose. However, these conventional approaches have the disadvantage of requiring multiple semiconductor chips.

In commonly assigned U.S. Pat. No. 4,546,375, VERTICAL IGFET WITH INTERNAL GATE, S. C. Blackstone et al., issued Oct. 8, 1985, an internally gated vertical MOSFET is disclosed. Although it might appear that the enhancement mode embodiment of such a structure would be suitable for relatively high power switching, the device inherently includes certain limitations which significantly limit its operating range. Basically, these limitations occur because of the presence of a relatively high gain parasitic bipolar transistor, the absence of a voltage-supporting semiconductor region (for blocking in each direction) and the relatively low quality of the gate oxide/silicon interface. In an effort to overcome these limitations the structure and fabrication method of the present invention was conceived.

SUMMARY OF THE INVENTION

A vertical MOSFET in a silicon wafer having opposing major surfaces includes a source electrode on one surface, a drain electrode on the second surface, and an internally disposed insulated gate. The insulated gate includes a conductive electrode surrounded by a gate insulator. The silicon between the insulated gate and each of the major surfaces is of first conductivity type and the silicon that is laterally adjacent to the insulated gate is of second conductivity type, such that a predetermined voltage on the insulated gate creates an inversion channel extending a predetermined distance into the laterally adjacent silicon. That portion of the laterally adjacent silicon where the inversion channel is formed is of relatively lightly doped material, whereas other areas of the laterally adjacent silicon is relatively heavily doped. The silicon that is between the insulated gate and each wafer surface includes a relatively lightly doped voltage-supporting region contiguous with the insulated gate and the laterally adjacent silicon and a relatively heavily doped region between this voltage-supporting region and the surface. Additionally, the interface between the gate oxide and the laterally adjacent silicon has a low density of interface states.

DETAILED DESCRIPTION OF PREFERRED EMBODIMENT

Figure 1:
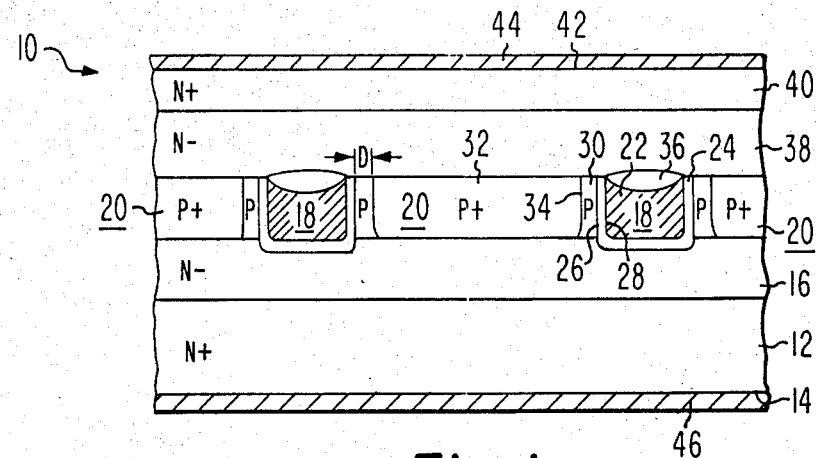
FIG. 1 is a sectional view of a structure of the present invention.

The structure of a vertical MOSFET device 10 of the present invention is described with reference to FIG. 1. A relatively heavily doped substrate 12 of first conductivity type provides a first major surface 14 of the device. For clarity in description, the first conductivity type is indicated as N type in the drawing. A relatively heavy substrate doping refers to a dopant concentration that yields a resistivity less than approximately 0.004 ohm-centimeters. A voltage-supporting region 16 of relatively lightly doped first conductivity type material is disposed across the heavily doped substrate 12. The voltage-supporting region is substantially planar in configuration and has a doping concentration and thickness governed by the voltage blocking specification of the final device. For example, a 3.0 micron thick layer doped to approximately $8 \times 10^{15}$ cm$^{-3}$ can support a voltage drop of approximately 50 volts thereacross.

Disposed on the voltage-supporting region 16 is an insulated gate 18 and laterally adjacent monocrystalline silicon 20 of second conductivity type. For example, the gate 18 may have a web-like configuration, with the laterally adjacent silicon arranged as a matrix of hexagons therein. The insulated gate 18 is substantially rectangular in cross-section and includes a conductive electrode 22 with (vertical) walls 28 that are perpendicular to the major surface 14. The material of the electrode 22 is preferably polycrystalline silicon, tungsten, molybdenum, tungsten silicide, titanium silicide, tantalum silicide or molybdenum silicide, although other refractory metals or silicides may work as well. The electrode 22 is surrounded by a gate insulator 24, and the interface between the gate insulator 24 and the laterally adjacent silicon 20, as identified at 26, is of high quality in that a low density of interface states are present. In the preferred embodiment the portion of the gate insulator 24 contiguous with the walls 28 is silicon oxide and the portion which separates the electrode 22 from the voltage-supporting region 16 is also silicon oxide. The top portion of the gate insulator 24, as identified at 36, may also include silicon oxide, but in the preferred embodiment is borophosphosilicate glass (BPSG) as will subsequently be elaborated upon.

The laterally adjacent monocrystalline silicon 20 includes material of relatively high conductivity and material of relatively low conductivity. The portion of the laterally adjacent silicon 20 that is contiguous with the oxide of the gate insulator 24 along the vertical walls 28 is relatively lightly doped, as identified at 30. All other areas of the laterally adjacent silicon 20 are relatively heavily doped, as identified at 32. Ideally the high/low junction 34 between the lightly doped portion 30 and heavily doped portion 32 is substantially vertical at a fixed distance from the vertical walls 28. However, in view of fabrication constraints, the high/low junction 34 will typically be further from the electrode 22 at points near the voltage-supporting region 16 and closer to the electrode 22 at points displaced from the voltage-supporting region. The optimum design distance that the lightly doped region 30 extends into the laterally adjacent silicon 20, as identified at D, is governed by the extent to which an inversion channel will be formed therein when the electrode 22 is biased to a particular voltage. In the preferred embodiment the distance D is approximately 1 micron.

Overlying the insulated gate 18 and laterally adjacent silicon 20 is a second relatively lightly doped voltage-supporting region of first conductivity type, as identified at 38. The thickness and dopant concentration within the second voltage-supporting region 38 is equivalent to that of the voltage-supporting region 16. Overlying the second voltage-supporting region 38 is a relatively heavily doped first conductivity type region 40, the surface of which defines the second major surface 42 of the semiconductor structure. The relatively heavily doped region 40 is doped so as to yield a sheet resistivity of approximately 10–15 ohms per square.

An anode electrode 44 is disposed on the second surface 42 and a cathode electrode 46 is disposed on the first surface 14. These electrodes may comprise conventional metallization such as aluminum. The gate electrode 22 may be contacted in a manner similar to that shown in previously cited U.S. Pat. No. 4,546,375, i.e., by exposing a portion thereof and forming electrode metal thereon.

Figure 2:
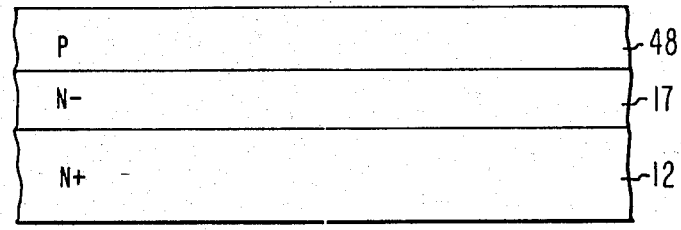
FIGS. 2 through 6 are sectional views that are representative of the fabrication process of the present invention.

A novel fabrication sequence for producing the device 10 is described with reference to FIGS. 2 through 6. As shown in FIG. 2, the starting point for the process comprises providing a relatively heavily doped substrate 12 of first conductivity type, epitaxially depositing a relatively lightly doped first conductivity type first epitaxial layer 17 thereon and epitaxially depositing a second layer 48, of second conductivity type, on the first epitaxial layer 17.

Figure 3:
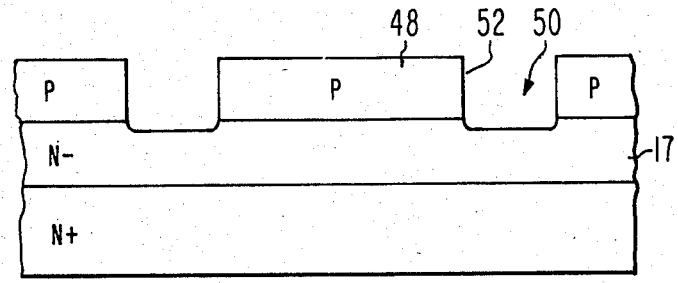
Figure 4:
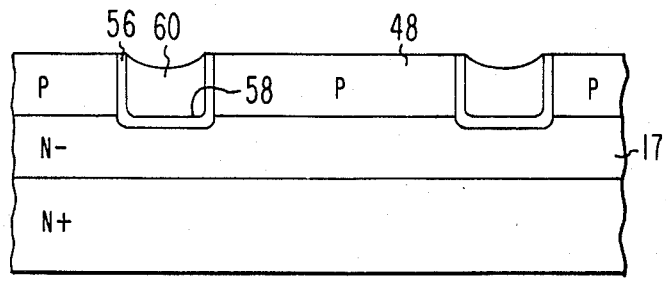

As shown in FIG. 3, one or more apertures 50 are then formed in the second epitaxial layer 48 so as to expose corresponding portions of the first epitaxial layer 17. Each aperture 50 is characterized by relatively perpendicular i.e. vertical walls 52 and preferably extends some predetermined shallow distance, e.g. approximately 500 Angstroms, into the first epitaxial layer 17. This apertured second epitaxial layer 48 may conveniently be formed by conventionally masking the blanket epitaxial layer and subjecting it to conventional dry etching such as plasma or reactive ion etching.

The aperture walls 52 and exposed portion of the first epitaxial layer 17 are then subjected to a thermal oxidation sequence whereby a thermal oxide 56 is grown to a predetermined thickness thereon. The thermal oxide 56 grown from the aperture walls 52 will ultimately become the gate oxide of the device so the thickness thereof should be in the approximately 500–1000 Angstrom range. A thermal oxide of this thickness will also yield, by design, an oxide surface 58 on the first epitaxial layer 17 that is substantially co-planar with the interface between the first epitaxial layer 17 and the overlying second epitaxial layer 48. It should further be understood that without further masking, this thermal oxidation process will also yield a layer of oxide on other exposed surfaces of the second epitaxial layer 48.

A conductive electrode 60 is then formed on the oxide within the aperture. When the electrode material is polycrystalline silicon, it may be conventionally deposited so as to substantially fill the aperture 50 as shown at 60. This polycrystalline silicon deposition, if unmasked, will also overlie the thermal oxide on the other surfaces of the second epitaxial layer. The polycrystalline silicon is then doped, for example, by diffusion of a relatively heavy concentration of first conductivity type dopant. By conventionally photolithographically masking the polycrystalline silicon 60 and thermal oxide 56 within the aperture, the polycrystalline silicon and oxide that formed on the other surfaces of the second epitaxial layer 48 can then be conveniently removed, so as to yield the structure of FIG. 4. As illustrated, the polycrystalline silicon 60 within the aperture is contiguous with the oxide, but tends to form a depression in the central portion of the top thereof of the deposit.

Figure 5:
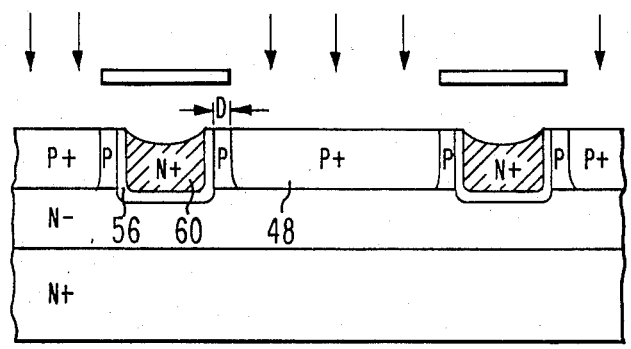

As shown schematically in FIG. 5, the structure is then appropriately conventionally photolithographically masked and the exposed portions thereof are subjected to a relatively heavy doping of second conductivity type dopant. This yields a relatively heavy P+ concentration in the portion of the second epitaxial layer 48 which is displaced from the oxide 56 by distance D. A convenient doping concentration would be approximately $5 \times 10^{19}$ cm$^{-3}$, and can be achieved, e.g., by ion implanting a dose of $10^{16}$ cm$^{-2}$ at 80 keV and then diffusing.

Figure 6:
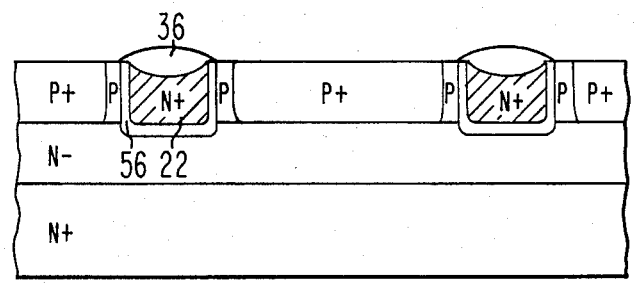

The gate insulation 24 around the gate electrode 22 is then completed by the deposition of an insulating material such as BPSG, as illustrated at 36 in FIG. 6. The insulation 36 may be chemically vapor deposited and is preferably a material which can readily be flowed, preferably at a relatively low temperature, e.g. 900°–950° C. Typically, this insulation 36 will be deposited as a blanket layer across the exposed surface of the second epitaxial layer 48, electrode 60 and surrounding oxide 56, flowed by heating to an appropriate temperature, selectively etched by conventional photolithographic means and then optionally reflowed, so as to leave the areas 36 on the electrodes 22 and surrounding oxide 56.

A relatively lightly doped third epitaxial layer of first conductivity type is then deposited across the structure of FIG. 6, for example, by the epitaxial lateral overgrowth techniques described in commonly assigned U.S. Pat. No. 4,549,926, METHOD FOR GROWING MONOCRYSTALLINE SILICON ON A MASK LAYER, J. F. Corboy, Jr. et al., issued Oct. 29, 1985. The top portion of this third epitaxial layer is then relatively heavily doped with a first conductivity type dopant so as to yield respectively, the second voltage-supporting region 38 and heavily doped region 40 as illustrated in FIG. 1. The anode and cathode electrodes 44 and 46 then may be applied by conventional deposition techniques such as by the evaporation of aluminum.

The described structure provides symmetrical voltage blocking during device operation because of the similar nature of the voltage-supporting regions 16 and 38. The parasitic bipolar transistor is effectively reduced by the incorporation of the relatively heavily doped P+ region 32 in areas of the laterally adjacent silicon beyond the portion thereof in which the channel is to be formed. The interface between the laterally adjacent silicon 20 and the oxide of the gate insulator 24 is of high quality owing to the fact that it is thermally grown on monocrystalline silicon. The present invention thus provides a structure readily available to power switching relatively high voltage DC or AC sources by applying a relatively low voltage to the gate electrode.

What is claimed is:

1. In a vertical MOSFET device including a silicon wafer having first and second opposing major surfaces, a source electrode disposed on the first surface, a drain electrode disposed on the second surface and an internally disposed insulated gate comprising a conductive electrode surrounded by a gate insulator, the silicon disposed between the insulated gate and each of the major surfaces being monocrystalline and of first conductivity type and the silicon disposed laterally adjacent to the insulated gate being monocrystalline and of second conductivity type, such that a predetermined voltage applied to the insulated gate creates an inversion channel for a predetermined distance in the laterally adjacent silicon, the improvement comprising:

a relatively lightly doped region disposed in that portion of the laterally adjacent silicon where the inversion channel is formed and relatively heavy doping in other areas of the laterally adjacent silicon;

a relatively lightly doped first voltage-supporting region disposed in that portion of the silicon that is contiguous with the insulated gate and is between both the insulated gate and the first wafer surface and the laterally adjacent silicon and the first wafer surface and a relatively heavily doped silicon region between the first voltage-supporting region and the first surface;

a relatively lightly doped second voltage-supporting region disposed in that portion of the silicon that is contiguous with the insulated gate and is between both the insulated gate and the second wafer surface and the laterally adjacent silicon and the first wafer surface and a relatively heavily doped silicon region between the second voltage-supporting region and the second surface; and an interface between the gate insulator and the laterally adjacent silicon that has a low density of interface states.

2. A device in accordance with claim 1 wherein the interface between the gate insulator and the laterally adjacent silicon comprises silicon oxide/silicon.

3. A device in accordance with claim 1 wherein the conductive gate electrode comprises a material selected from the group consisting of:

polycrystalline silicon, tungsten, molybdenum, tungsten silicide, titanium silicide, tantalum silicide and molybdenum silicide.

* * * * *